United States Patent
Fisher et al.

(10) Patent No.: US 6,825,114 B1
(45) Date of Patent: Nov. 30, 2004

(54) SELECTIVE STRESS-INDUCING IMPLANT AND RESULTING PATTERN DISTORTION IN AMORPHOUS CARBON PATTERNING

(75) Inventors: Philip A. Fisher, Foster City, CA (US); Christopher F. Lyons, Fremont, CA (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/424,675

(22) Filed: Apr. 28, 2003

(51) Int. Cl.$^7$ ............................................. H01L 21/44
(52) U.S. Cl. ........................................ 438/661; 438/770
(58) Field of Search ................................ 438/661, 649, 438/651, 655, 656, 657, 680, 681, 682, 683, 684, 685, 721, 755, 770, 771, 772, 773, 775, 776, 777, 942, 954, 9

(56) References Cited

U.S. PATENT DOCUMENTS

| | | |
|---|---|---|
| 5,185,293 A | 2/1993 | Franke et al. |
| 5,656,128 A | 8/1997 | Hashimoto et al. |
| 5,721,090 A | 2/1998 | Okamoto et al. |
| 5,759,746 A | 6/1998 | Azuma et al. |
| 5,981,398 A * | 11/1999 | Tsai et al. .................... 438/710 |
| 6,030,541 A * | 2/2000 | Adkisson et al. ............. 216/51 |
| 6,140,200 A | 10/2000 | Eldridge |
| 6,350,390 B1 * | 2/2002 | Liu et al. ....................... 216/59 |
| 6,365,320 B1 * | 4/2002 | Foote et al. .............. 430/270.1 |
| 6,368,924 B1 | 4/2002 | Mancini et al. |
| 6,388,924 B1 | 5/2002 | Nasu |
| 6,413,852 B1 | 7/2002 | Grill et al. |
| 6,573,030 B1 * | 6/2003 | Fairbairn et al. ............ 430/323 |
| 6,596,553 B1 * | 7/2003 | Lin et al. ....................... 438/14 |
| 6,673,684 B1 * | 1/2004 | Huang et al. ............... 438/299 |

OTHER PUBLICATIONS

U.S. patent application No. 10/215,173, entitled "Use of Amorphous Carbon Hard Mask for Gate Patterning to Eliminate Requirement of Poly Re–Oxidation", as filed on Aug. 8, 2002, including claims, drawings, and abstract (29 pages).

U.S. patent application No. 10/277,760, entitled "Sacrificial Air Gap Layer for Insulation of Metals", as filed on Aug. 8, 2002, including claims, drawings, and abstract (17 pages).

U.S. patent application No. 10/244,650, entitled "Use of Multilayer Amorphous Carbon Arc Stack to Eliminate Line Warpage Phenomenon", as filed on Sep. 16, 2002, including claims, drawings, and abstract (30 pages).

U.S. patent application No. 10/217,730, entitled "Ion Implantation to Modulate Amorphous Carbon Stress", as filed on Aug. 13, 2002, including claims, drawings, and abstract (29 pages).

U.S. patent application No. 10/424,420, entitled "Use of Amorphous Carbon for Gate Patterning", filed Apr. 28, 2003, by Fisher et al.

(List continued on next page.)

*Primary Examiner*—David Nhu
(74) *Attorney, Agent, or Firm*—Foley & Lardner LLP (57) ABSTRACT

A method of forming a fuse for use in an integrated circuit using an amorphous carbon mask includes providing a mask material layer comprising amorphous carbon over a conductive layer. The mask material layer is doped with nitrogen, and an anti-reflective coating (ARC) feature is formed over the mask layer. A portion of the mask material layer is removed according to the ARC feature to form a mask, and the ARC feature is removed to form a warped mask. The conductive layer is patterned according to the warped mask, the warped mask is removed, and a silicide layer is provided over the patterned conductive layer.

20 Claims, 5 Drawing Sheets

OTHER PUBLICATIONS

U.S. patent application No. 10/230,794, entitled "Formation of Amorophous Carbon Arc Stack Having Graded Transition Between Amorophous Carbon and Arc Material", as filed on Aug. 29, 2002, including claims, drawings, and abstract (29 pages).

U.S. patent application No. 10/230,775, entitled "Use of Buffer Dielectric Layer with Amorphous Carbon Mask to Reduce Line Warpage", as filed on Aug. 29, 2002, including claims, drawings, and abstract (28 pages).

U.S. patent application No. 10/335,726, entitled "Use of Diamond as a Hard Mask Material", as filed on Jan. 2, 2003, including claims, drawings, and abstract (26 pages).

U.S. patent appliacation No. 10/445,129, entitled "Modified Film Stack and Patterning Strategy for Stress Compensation and Prevention of Pattern Distortion in Amorphous Carbon Gate Patterning", as filed on May 20, 2003, including claims, drawings, and abstract (29 pages).

Wolf, S., Tauber, R. N., "Silicon Processing For the VLSI Era", Lattice Press, Sunset Beach, CA; 1986; pp. 322, 384–385, 556–557.

* cited by examiner

SELECTIVE STRESS-INDUCING IMPLANT AND RESULTING PATTERN DISTORTION IN AMORPHOUS CARBON PATTERNING

CROSS-REFERENCE TO RELATED PATENT APPLICATIONS

This application is related to U.S. patent application Ser. No. 10/215,173 entitled "Use of Amorphous Carbon Hard Mask for Gate Patterning to Eliminate Requirement of Poly Re-Oxidation," U.S. patent application Ser. No. 10/277,760 entitled "Sacrificial Air Gap Layer for Insulation of Metals," U.S. patent application Ser. No. 10/244,650 entitled "Use of Multilayer Amorphous Carbon Hard Mask to Eliminate Line Warpage Phenomenon," U.S. patent application Ser. No. 10/424,420 entitled "Use of Amorphous Carbon for Gate Patterning," U.S. patent application Ser. No. 10/230,794 entitled "Formation of Amorphous Carbon ARC Stack Having Graded Transition Between Amorphous Carbon and ARC Material," U.S. Patent Application No. 60/399,768 entitled "Use of Diamond as a Hard Mask Material," U.S. patent application Ser. No. 10/230,775 entitled "Use of Buffer Dielectric Layer with Amorphous Carbon Mask to Reduce Line Warpage," and U.S. patent application Ser. No. 10/217,730 entitled "Ion Implantation to Modulate Amorphous Carbon Stress," each of which is assigned to the assignee of the present application and which were filed on the same date as the present application.

FIELD OF THE INVENTION

The present invention relates generally to the field of integrated circuits and methods of manufacturing integrated circuits. More particularly, the present invention relates to the formation of fuses using masks comprising amorphous carbon.

BACKGROUND OF THE INVENTION

In various integrated circuit (IC) applications, it is desirable to produce simple, inexpensive, one-time programmable elements. For example, to assist in the identification of individual integrated circuits (ICs), a number of fuses may be provided in the IC. These fuses can be used to assign a unique identifier or serial number for the IC by "blowing" a selected number of the fuses. This is typically accomplished by running a large amount of current to the fuses that are to be blown to cause melting of the fuse material. The melting and subsequent agglomeration of fuse material dramatically increase the resistance in the fuse. The blown fuses may later be identified by comparing resistance measurements for the blown fuses with that of a reference fuse.

Figure 1:
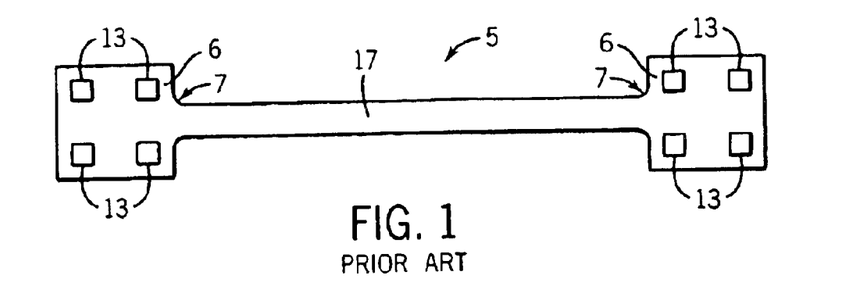
FIG. 1 is a schematic top view of a conventional fuse formed in an integrated circuit.

A typical fuse 5 is illustrated in FIG. 1. Fuse 5 includes a conductive linear region 17 that extends between two terminals 6. A number of contacts 13 are connected to the terminals for providing current through linear region 17. Linear region 17 is conventionally formed as a polysilicon layer with a metal silicide layer formed thereon. Because the metal silicide material typically has a lower resistance than the polysilicon material, current will pass through the metal silicide layer.

When an excessive current density (e.g., $10^5$ to $10^6$ amperes/cm$^2$ or greater) is provided to linear region 17, a portion of the metal silicide layer will melt. The melted material will then agglomerate to form a hole in the silicide layer. Current passed through linear region 17 will then be forced to travel through the polysilicon layer. Because the resistivity of the polysilicon layer is greater than that for silicide, the overall resistance of linear region 17 is dramatically increased.

One issue that has been identified with conventional fuses concerns the reliability of the fuses to perform in an expected manner. In certain circumstances, a fuse may not blow even when a high current is applied to the fuse that would normally cause melting and agglomeration of silicide material. Where fuses fail to perform as expected, the fuse may be misprogrammed and may lead to misidentification of the IC in the example of a unique serial number described above.

One reason that fuses may not perform as expected in all situations is that conventional fuses have a limited number of "weak" or "hot" spots where silicide material tends to melt. For example, where a portion of the fuse has a reduced cross-sectional area, a greater amount of current per unit area will be present in the portion, as compared to surrounding areas, causing the "weak" spot having a reduced cross-sectioned area to melt before the surrounding areas. Additional areas of weakness may be found where a relatively sharp corner or transition occurs, such as that found at corners 7 shown in FIG. 1. If linear portion 17 has a generally uniform cross-section, the areas of weakness for fuse 5 would typically be at corners 7. While generally a fuse having two weak spots will perform as expected, in certain circumstances these weak spots may not melt even where high current is passed through the weak spots.

Thus, there is a need to form fuses in an integrated circuit that have increased reliability. Further, there is a need to form fuses that have a larger number of weak spots that melt when a large amount of current is provided to the fuse. Even further, there is a need to use an amorphous carbon mask to form fuses. Even further still, there is a need for a method of producing integrated circuit fuses that have increased reliability using a mask comprising amorphous carbon.

SUMMARY OF THE INVENTION

One exemplary embodiment relates to a method of forming a fuse for use in an integrated circuit. The method includes providing a mask material layer over a conductive layer, where the mask material layer comprises amorphous carbon. The method also includes doping the mask material layer with nitrogen, forming an anti-reflective coating (ARC) feature over the mask layer, and removing a portion of the mask layer according to the ARC feature to form a mask. The method further includes removing the ARC feature to form a warped mask, patterning the conductive layer according to the warped mask, and removing the warped mask. The method further includes providing a silicide layer over the patterned conductive layer.

Another exemplary embodiment relates to a method of forming a fuse in an integrated circuit. The method includes depositing a layer comprising amorphous carbon above a layer of polysilicon, introducing nitrogen into the layer comprising amorphous carbon, and forming an anti-reflective coating (ARC) mask over above the layer comprising amorphous carbon. The method also includes patterning the layer comprising amorphous carbon according to the ARC mask to form a mask feature and altering the shape of the mask feature by removing the ARC mask to form a mask feature having a non-linear shape. The method further includes removing a portion of the layer of polysilicon according to the mask feature to form a non-linear polysilicon feature and providing a layer comprising a metal silicide above the non-linear polysilicon feature.

A further exemplary embodiment relates to a fuse for an integrated circuit produced by a method that includes providing a mask material comprising amorphous carbon and nitrogen above a layer of polysilicon. The method also includes providing a cap layer over the mask material, where the cap layer comprises an anti-reflective coating (ARC) material. The method further includes etching the cap layer to form a cap feature, patterning the mask material according to the cap feature to form a mask, and removing the cap feature to warp the mask. The method further includes patterning the layer of polysilicon according to the mask after the cap feature is removed to form a polysilicon feature, removing the mask, and forming a silicide layer above the polysilicon feature.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 2:
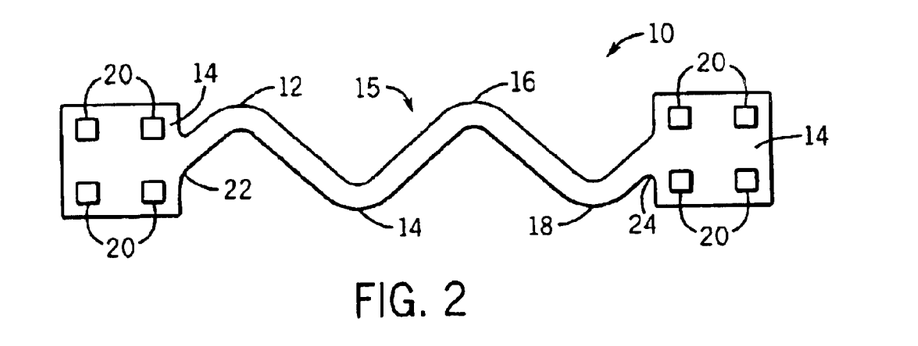
FIG. 2 is a schematic top view of a fuse formed in accordance with an exemplary embodiment that includes a non-linear fuse feature.
Figure 3A:
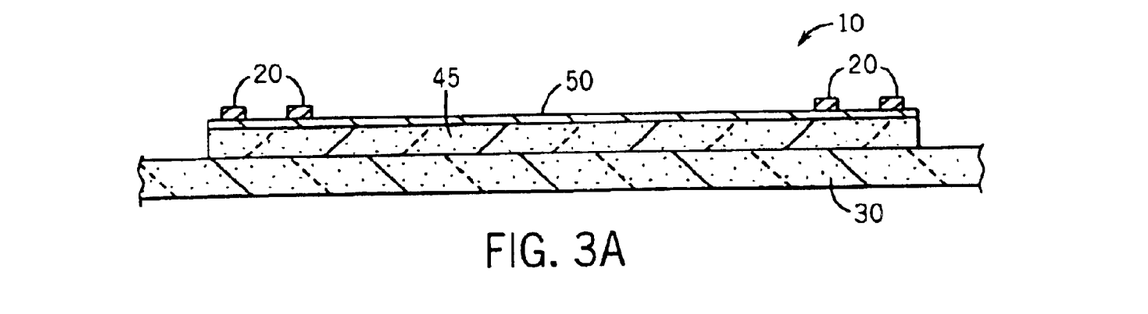
FIG. 3A is a schematic side view of the fuse shown in FIG. 2 in an operable or unblown condition.

Referring to FIGS. 2 and 3A, a fuse 10 formed as part of an integrated circuit (IC) includes two terminals 14 and an extended portion 15 intermediate terminals 14. Extended portion 15 includes a substrate 30, a conductive material layer 45, and a silicide layer 50. A number of contacts 20 are provided at terminals 14 to provide current to fuse 10.

Fuse 10 is preferably part of an ultra-large-scale integrated (ULSI) circuit having a million or more transistors, and is manufactured as part of the IC on a wafer made of a semiconducting material (e.g., silicon, gallium arsenide, etc.). Fuse 10 can be utilized in volatile and non-volatile memory devices, microprocessors, application-specific ICs, PALs, PLAs, or any of a variety of other IC devices.

Conductive material layer 45 can be a metal, a polysilicon, or polysiliconigermanium ($Si_xGe_{(1-x1)}$) material. Conductive material layer 45 may be doped or undoped. In an exemplary embodiment, conductive material layer 45 is made of a polysilicon material and has a thickness between approximately 50 and 100 nanometers, a cross-sectional width of between approximately 30 and 50 nanometers, and a length of between approximately 300 and 500 nanometers.

As shown in the exemplary embodiment of FIG. 2, extended portion 15 preferably has a generally non-linear or warped configuration. Extended portion 15 includes a number of curves or transition areas (e.g., 12, 14, 16, 18) that are configured to melt or "blow" when an excessive amount of current (e.g., 0.1–1.0 mA or more) is passed through extended portion 15. The curvature of extended portion 15 in these areas creates weak spots where the material transitions from one direction to another. Weak spots are also formed at corners 22, 24, as with conventional fuses.

While fuse 10 is shown as having four transition areas 12, 14, 16, and 18, a different number of transition areas can be formed in extended region 15 in alternative embodiments. For example, 5 or more transition areas may be formed. Increasing the number of transition areas in extended region 15 increases the likelihood that material in one or more of the curved regions melts when excessive current is passed through extended portion 15.

One advantageous feature of forming extended portion 15 with a generally non-linear or curved shape is that fuse 10 has an increased number of "weak spots" as compared to fuses formed by conventional methods (e.g., fuses such as that shown in FIG. 1). For example, one or more of areas 12, 14, 16, 18, 22, and 24 may be conducive to "blowing" when a large current is passed through extended portion 15. This increases the likelihood that material will melt in at least one of the weak spots, which increases the overall reliability of fuse 10.

FIG. 3A shows fuse 10 in an operable or "unblown" state. Both conductive material layer 45 and silicide layer 50 are continuous along the length of extended portion 15. In this configuration, current passes through silicide layer 50 unimpeded (current travels through the path of least resistance, and therefore travels through the silicide layer rather that the polysilicon layer, which has a much larger resistance than the silicide layer).

Figure 3B:
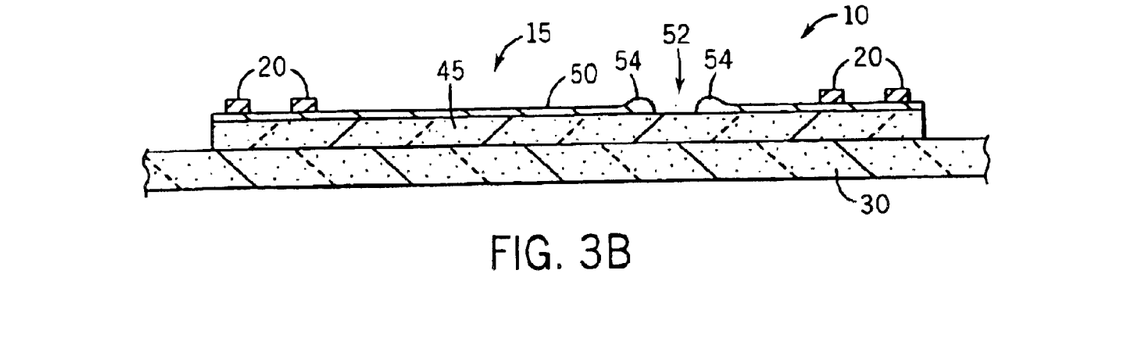
FIG. 3B is a schematic side view of the fuse shown in FIG. 2 in an open circuit or blown condition.

FIG. 3B shows fuse 10 after an excessive amount of current has been provided through extended portion 15. A hole or open circuit 52 is formed in silicide layer 50 that extends to conductive material layer 45. Open circuit 52 corresponds to area 18 (FIG. 2), which is formed as a weak spot in extended portion 15 due to its curvature. Of course, any of the weakened areas 12, 14, 16, 18, 22, 24 may be a site for the formation of an open circuit, and the melting of area 18 is given only as an example.

To form open circuit 52, a portion of silicide layer 50 melts due to the heat generated by the excessive current. The melted material solidifies after the current is removed to form agglomeration regions 54. The movement of silicide material to agglomeration regions leaves a hole or open circuit 52 between agglomeration regions 54. Because the resistivity of the material used to form conductive material layer 45 (e.g., polysilicon) is much higher than that of silicide, fuse 10 has a much larger resistance after formation of open circuit 52. That is, current cannot travel through extended portion 15 as easily as if silicide layer 50 was continuous along the length of extended portion 15. Fuse 10 is thus programmed to register as having a largely increased resistance (e.g., when compared to a reference fuse). Where a large number of fuses are provided in an integrated circuit, the combination of blown and unblown fuses may provide an indication of a serial number or other permanent identifier for the integrated circuit.

One material that may be used as a hard mask in the formation of integrated circuit fuses is amorphous carbon. Amorphous carbon masks may be formed to have very small critical dimensions (e.g., 30–50 nanometers or less). At very small critical dimensions, however, internal stresses in the amorphous carbon material cause the mask to warp or "wiggle." For example, if the amorphous carbon mask is not constrained (e.g., by using a cap layer of anti-reflective coating (ARC) material), the mask will warp to form a generally curved shape along its length. This warped shape may then be transferred to an underlying material layer using conventional etching and mask techniques.

It has been discovered that the internal stress properties of amorphous carbon may be altered by selectively implanting nitrogen into the amorphous carbon material. For example, while amorphous carbon masks formed from pure amorphous carbon will warp at critical dimensions of between approximately 30 and 40 nanometers, amorphous carbon masks comprising approximately 9 atomic percent nitrogen will warp at larger critical dimensions (e.g., 45 and 50 nanometers). Additionally, the warped regions formed in amorphous carbon masks implanted with approximately 9 atomic percent nitrogen have curves or transition areas formed farther apart than occurs in pure amorphous carbon masks. For example, the distance between transition areas in amorphous carbon masks doped with approximately 9 atomic percent nitrogen is between approximately 2 to 4 times the distance between transition areas formed in pure amorphous carbon masks. By adjusting the amount of nitrogen implanted in an amorphous carbon material, the degree and other characteristics of mask warpage can be controlled.

A method for producing fuse 10 that forms fuses having an increased number of weak spots will now be described with reference to FIGS. 4 through 12. FIG. 13 is a flow diagram that outlines a process 200 used in the formation of fuse 10.

Figure 4:
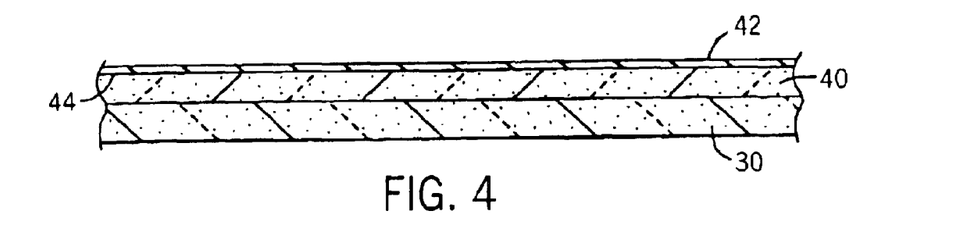
FIG. 4 is a schematic cross-sectional view of the fuse shown in FIG. 2 illustrating a polysilicon deposition step.

In a step 210 illustrated in FIG. 4, a layer 40 of conductive or semiconductive material is provided above a substrate 30. Layer 40 preferably comprises polysilicon, and may be doped or undoped. Other conductive or semiconductive materials may also be used for layer 40. Layer 30 may be silicon dioxide, silicon nitride, or any other material that may act as a substrate for fuse 10. In an exemplary embodiment, layer 40 is polysilicon deposited by chemical vapor deposition and layer 30 is deposited silicon dioxide. In an alternative embodiment, layer 40 may include multiple layers of material, one or more of which may include polysilicon.

In an exemplary embodiment, layer 40 has a thickness of between approximately 500 and 1,000 angstroms. In an alternative embodiment, layer 40 has a thickness of between approximately 1,200 and 1,500 angstroms.

When layer 40 is formed, a thin layer 42 of oxide forms on the top or upper surface 44 of layer 40. Oxide layer 42 may be referred to as a "native" oxide layer. The thickness of oxide layer 42 may vary depending on various processing conditions, and may have a discontinuous or varying thickness. In an exemplary embodiment, the thickness of oxide layer 42 is between approximately 5 and 20 angstroms.

Figure 5:
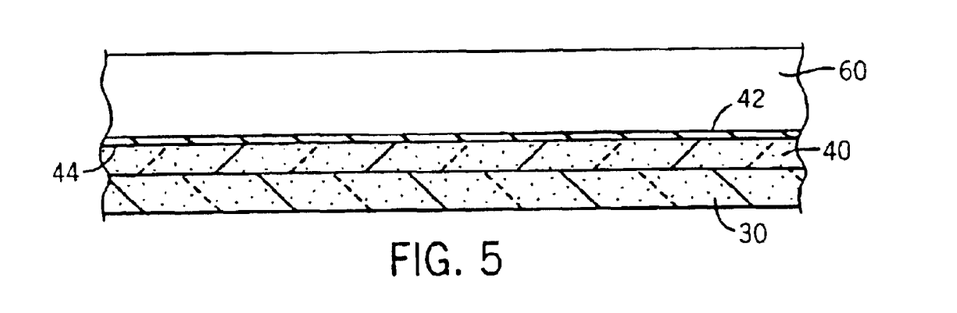
FIG. 5 is a schematic cross-sectional view of the fuse shown in FIG. 2 illustrating an amorphous carbon layer deposition step.
Figure 6:
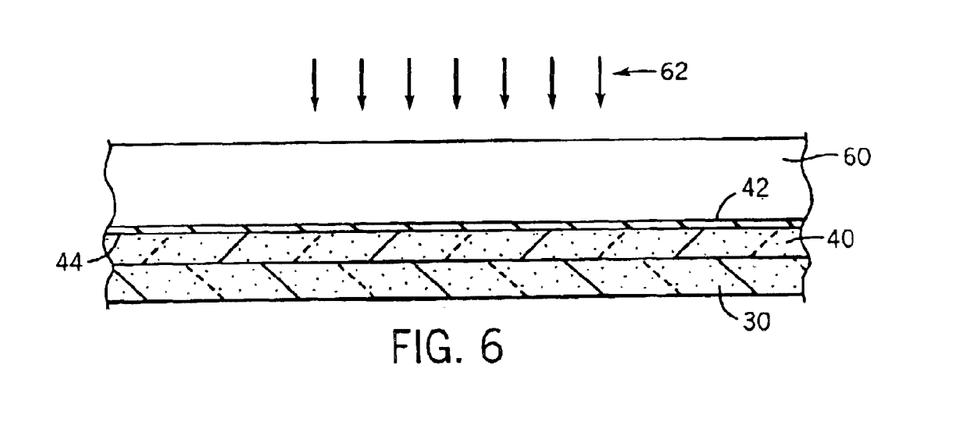
FIG. 6 is a schematic cross-sectional view of the fuse shown in FIG. 2 illustrating a nitrogen implantation step.

In a step 220 shown in FIG. 5, a layer or film 60 of mask material comprising amorphous carbon is deposited above or over polysilicon layer 40. Layer 60 is deposited in a plasma-enhanced chemical vapor deposition (PECVD) process using a hydrocarbon atmosphere including at least one of methane ($CH_4$), ethane ($C_2H_6$), propylene ($C_3H_6$), and other hydrocarbons. The PECVD process is performed at a temperature of between approximately 400° and 550° C. and a pressure of between approximately 5 and 10 torr with a plasma power of between approximately 800 and 1,500 watts.

In a preferred embodiment, amorphous carbon layer 60 has a thickness of between approximately 400 and 800 angstroms. In alternative embodiments, the thickness of amorphous carbon layer 60 may vary depending on various design considerations. For example, amorphous carbon layer may have a thickness of less than 1,000 angstroms (e.g., between 400 and 800 angstroms or less). In another alternative embodiment, amorphous carbon layer may have a thickness of greater than 1,200 angstroms (e.g., between 1,200 and 1,500 angstroms or greater).

One advantageous feature of providing an amorphous carbon layer that may be produced with various thicknesses is that the amorphous carbon layer may be produced in a thickness suitable for patterning layer 40. For example, where a particular thickness of polysilicon is provided as layer 40, the thickness of the amorphous carbon layer may be altered so that the proper amount of mask material is provided over the polysilicon material to compensate for the etch selectivities of the materials used. This allows for increased manufacturing efficiency by eliminating unnecessary material use.

In a preferred embodiment, amorphous carbon layer 60 is deposited above polysilicon layer 40 in a pure or undoped form, after which it is doped with nitrogen. In a step 230 shown in FIG. 6, nitrogen ions are accelerated at an energy of between approximately 5 and 15 keV at an implant dose of between approximately 1 e16 and 1e17 dopants/$cm^2$ to provide approximately 9 atomic percent nitrogen in amorphous carbon layer 60. The amount of nitrogen implanted into amorphous carbon layer 60 may differ in alternative embodiments. Between approximately 3 and 9 atomic percent nitrogen may be implanted in alternative embodiments.

In an alternative embodiment, the amorphous carbon layer may be deposited with nitrogen incorporated therein. For example, the amorphous carbon layer as deposited may include between approximately 6 and 12 atomic percent nitrogen. To deposit a nitrogen-containing amorphous carbon layer, a PECVD process using an atmosphere of propylene ($C_3He$) and nitrogen is used. To achieve a doping concentration of approximately 6 atomic percent nitrogen, for example, a flow ratio approximately 1:10 is used for the propylene to nitrogen gas flow rate (e.g., 300 cubic centimeters of propylene per minute to 3 liters of nitrogen per minute). In alternative embodiments, various other nitrogen concentrations may be achieved by varying the various processing conditions (e.g., increasing or decreasing the gas flow ratio of propylene to nitrogen, etc.).

In another alternative embodiment, nitrogen may be introduced into amorphous carbon layer 60 using a thermal diffusion process, in which a later of material including nitrogen is deposited above the amorphous carbon material. For example, a silicon oxynitride (SiON) layer may be deposited above the amorphous carbon material, after which the temperature in the processing chamber may be raised to between approximately 600 and 800° C. for a period of between approximately 1 and 10 minutes to cause nitrogen to diffuse into the amorphous carbon layer. Altering the amount of nitrogen in the layer deposited above the amorphous carbon layer, the temperature, or the duration of the thermal diffusion may alter the amount of nitrogen diffusing into the amorphous carbon layer. In this manner, the amount of nitrogen introduced into the amorphous carbon layer may be controlled.

In other alternative embodiments, only a portion of the amorphous carbon layer is doped with nitrogen. For example, lithographic techniques can be used so that only selected areas along extended region 15 are doped with nitrogen. This may allow for increased control of the location of points of weakness in fuse 10. In other example, a top portion of the amorphous carbon layer may be doped, while a bottom portion of the amorphous carbon layer may comprise pure or undoped amorphous carbon. In yet another example, the amorphous carbon layer may include alternating layers of doped and undoped amorphous carbon material. In still another example, a mask may be provided above the amorphous carbon layer to carefully control areas into which nitrogen is introduced.

Figure 7:
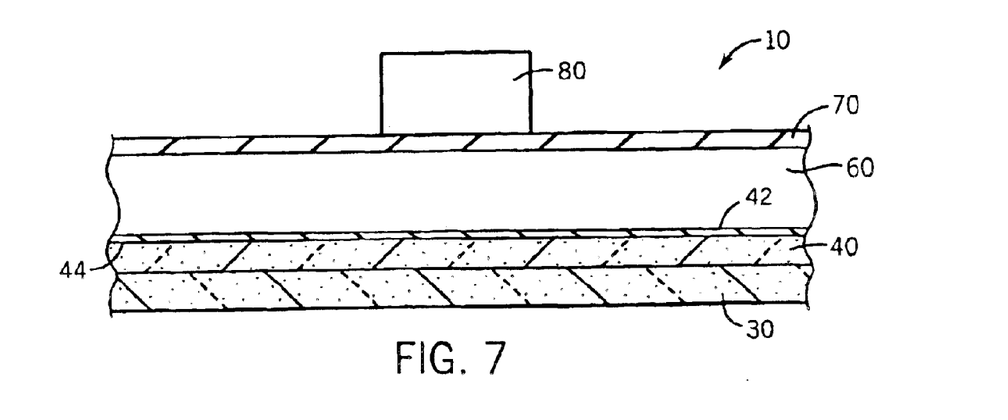
FIG. 7 is a schematic cross-sectional view of the fuse shown in FIG. 2 illustrating an anti-reflective coating (ARC) layer deposition and mask formation step.

In a step 240 shown in FIG. 7, a cap layer 70 is provided or deposited above amorphous carbon layer 60. To facilitate the description below, amorphous carbon layer 60 will be described with reference to the preferred embodiment described above, in which a layer of amorphous carbon is deposited in pure form and implanted with nitrogen. Amorphous carbon layer 60 can be formed in any of a variety of ways depending on the desired amorphous carbon layer properties, as described above with regard to the various alternative embodiments, and may be doped in any of a variety of ways (e.g., implanting, thermal diffusion, as deposited, etc.).

Cap layer 70 may be formed of an anti-reflective material to form an anti-reflective coating (ARC) layer. Cap layer 70 may include silicon nitride (SiN), silicon oxynitride (SiON), silicon-rich oxide (e.g., nonstoichiometric oxide-containing silicon material), silicon-rich nitride, and the like. In an exemplary embodiment, cap layer 70 has a thickness of between approximately 200 and 400 angstroms. One advantageous feature of using a cap layer formed from an anti-reflective material is that the amorphous carbon layer is protected during deposition and exposure of a photoresist material above amorphous carbon layer 60 and that reflection of ultraviolet (UV) rays used in the exposure of the photoresist will be reduced.

In a step 250, a layer of photoresist material is deposited above or over cap layer 70 (e.g., by spin-coating) and exposed to form a photoresist feature 80. The layer of photoresist is deposited by spin coating at a thickness of between approximately 2,000 and 4,000 angstroms and is patterned to have a width of between approximately 100 and 150 nanometers. Any of a variety of photoresist materials may be used, including photoresist materials that may be patterned using UV rays having wavelengths of 193 or 248 nanometers.

Figure 8:
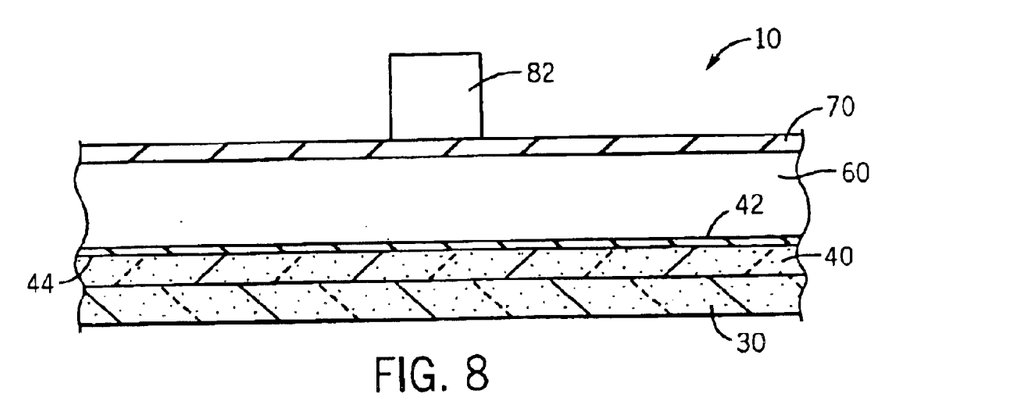
FIG. 8 is a schematic cross-sectional view of the fuse shown in FIG. 2 illustrating a mask trimming step.

In a step 260 shown in FIG. 8, photoresist feature 80 is trimmed to form a photoresist mask 82 having reduced dimensions. Trimming is accomplished by oxidizing the photoresist feature and removing the oxidized portion, which results in a photoresist mask having reduced dimensions. The thickness of the photoresist mask formed may depend on the trim rate. For example, in an exemplary embodiment, a trim etching step may erode or remove between approximately 3 to 4 nanometers per second in the vertical direction and between approximately 1.5 and 2.5 nanometers per second in the lateral direction. Other trim rates may be used, and may depend on the type of photoresist material used.

In an exemplary embodiment, photoresist mask 82 has a thickness of between approximately 1,000 and 2,500 angstroms and a width of between approximately 30 and 50 nanometers after trim etching. In alternative embodiments, photoresist mask may have a thickness of between approximately 2,000 and 3,000 angstroms and a width of approximately 70 and 90 nanometers after trim etching.

Figure 9:
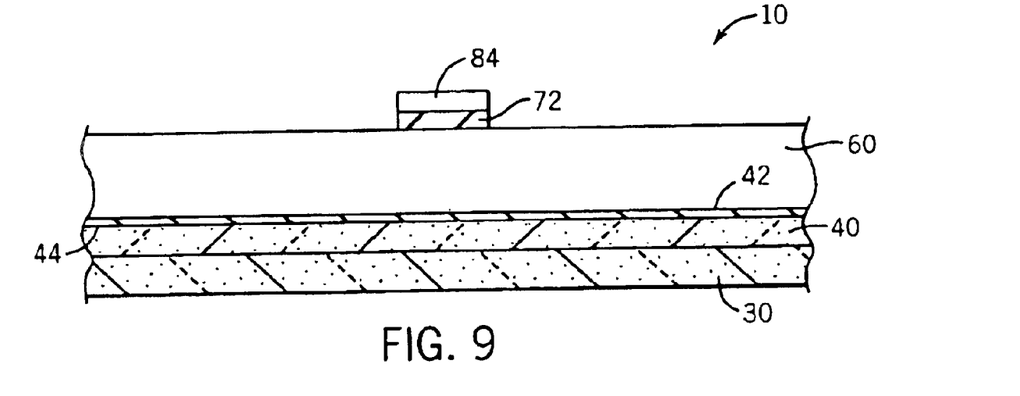
FIG. 9 is a schematic cross-sectional view of the fuse shown in FIG. 2 illustrating an ARC feature formation step.

In a step 270 shown in FIG. 9, photoresist mask 82 is used as a mask to pattern cap layer 70 to form a cap feature 72. A small amount of photoresist material 84 remains through the etching and overetching of cap layer 70. In an exemplary embodiment, cap layer 70 is etched using a fluorine-based plasma (e.g., $CF_4$, $CF_4/CHF_3$, etc.). The etching is performed in an argon or helium atmosphere at a temperature of between approximately 30 and 50° C. and a pressure of between approximately 2 and 7 mTorr.

Figure 10:
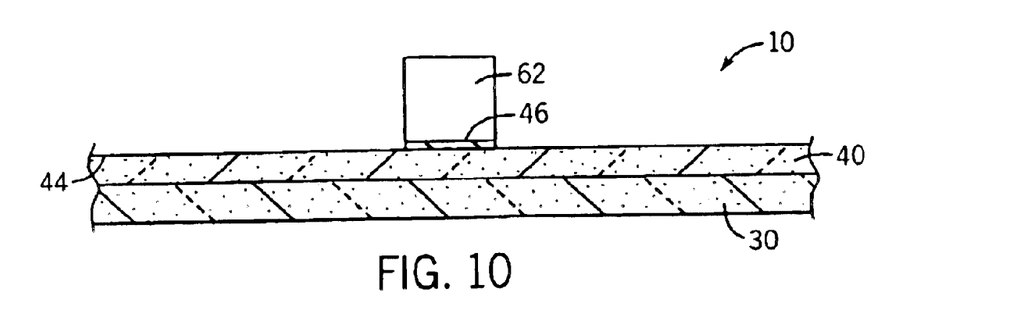
FIG. 10 is a schematic cross-sectional view of the fuse shown in FIG. 2 illustrating an amorphous carbon mask formation and breakthrough etch step.

In a step 280 shown in FIG. 10, cap feature 72 is used as a mask to pattern amorphous carbon layer 60 to form amorphous carbon feature or mask 62. In an exemplary embodiment, amorphous carbon layer 60 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts.

Using the plasma etch method described above, amorphous carbon mask 62 is formed without the introduction of aqueous etchants, which may damage or destroy mask 62 as processing proceeds. For example, the use of phosphoric acid as an etchant is eliminated by using amorphous carbon, since portions of the amorphous carbon layer may be removed using a plasma etch.

In a step 290, a breakthrough etch is performed to remove oxide layer 42 from surface 44 of polysilicon layer 40 prior to patterning polysilicon layer 40. The breakthrough etch also removes cap feature 72 and any remaining photoresist material 84. A portion 46 of oxide layer 42 may remain beneath mask 62.

After cap feature 72 is removed from amorphous carbon mask 62, the internal stresses in amorphous carbon mask 62 are no longer constrained by cap feature 72. Amorphous carbon mask 62 warps in response to its internal stresses in an attempt to reduce the overall internal energy of the amorphous carbon mask. The shape of the mask is thus altered to form a mask feature having a generally non-linear or curved shape (e.g., the mask feature may have straight or linear regions joined by curves or transition areas, may have a generally "wavy" shape, etc.). The shape of mask 62 may then be transferred to polysilicon layer 40 (e.g., a non-linear shape of the mask is patterned in the polysilicon layer to form a polysilicon feature having a similar non-linear shape).

In an exemplary embodiment, amorphous carbon mask 62 has a width of between approximately 30 and 60 nanometers. In alternative embodiments, the amorphous carbon mask may have a width of less than 30 nanometers (e.g., 10–25 nanometers, etc.) or greater than 60 nanometers (e.g., 60–80 nanometers, etc.).

Figure 11:
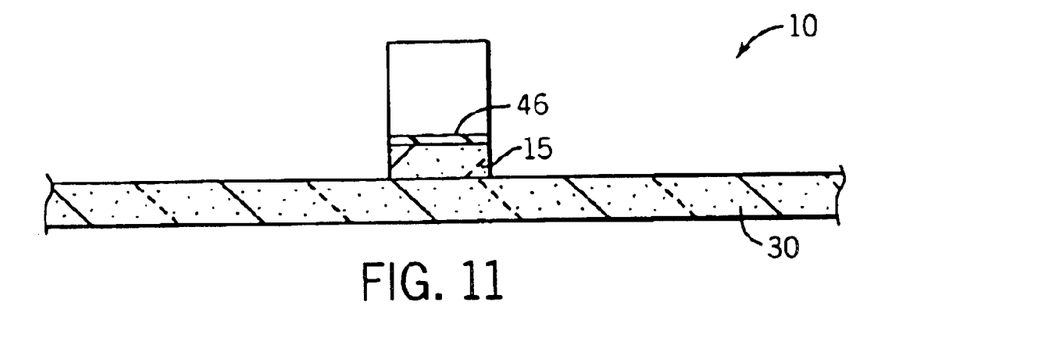
FIG. 11 is a schematic cross-sectional view of the fuse shown in FIG. 2 illustrating a fuse formation step.

In a step 300 shown in FIG. 11, amorphous carbon mask 62 is used to pattern or form features in polysilicon layer 40. For example, polysilicon layer 40 may be etched to form conductive material layer 15 in extended portion 15 of fuse 10. Because mask 62 has a generally warped or curved shape, the feature formed in polysilicon layer 40 will have a similar warped or curved shape. In this manner, a fuse having an increased number of weak points may be formed. The polysilicon etch is performed using HBr and $Cl_2$ at a temperature of between approximately 40 and 70° C. and a pressure of between approximately 2 and 7 mTorr.

Figure 12:
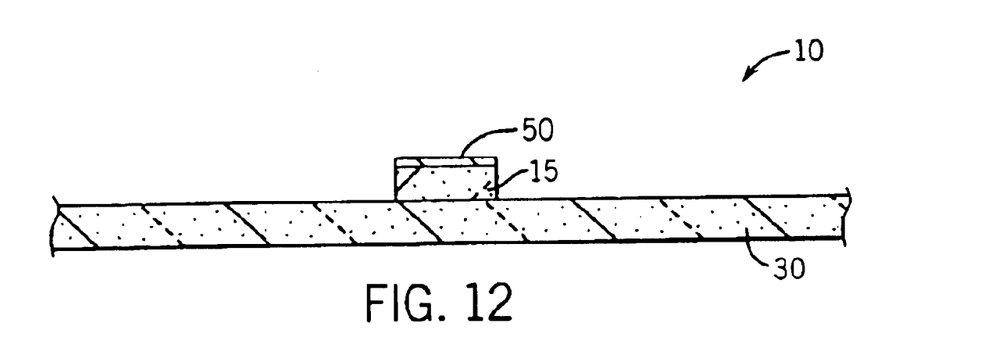
FIG. 12 is a schematic cross-sectional view of the fuse shown in FIG. 2 illustrating a silicide layer formation step.
Figure 13:
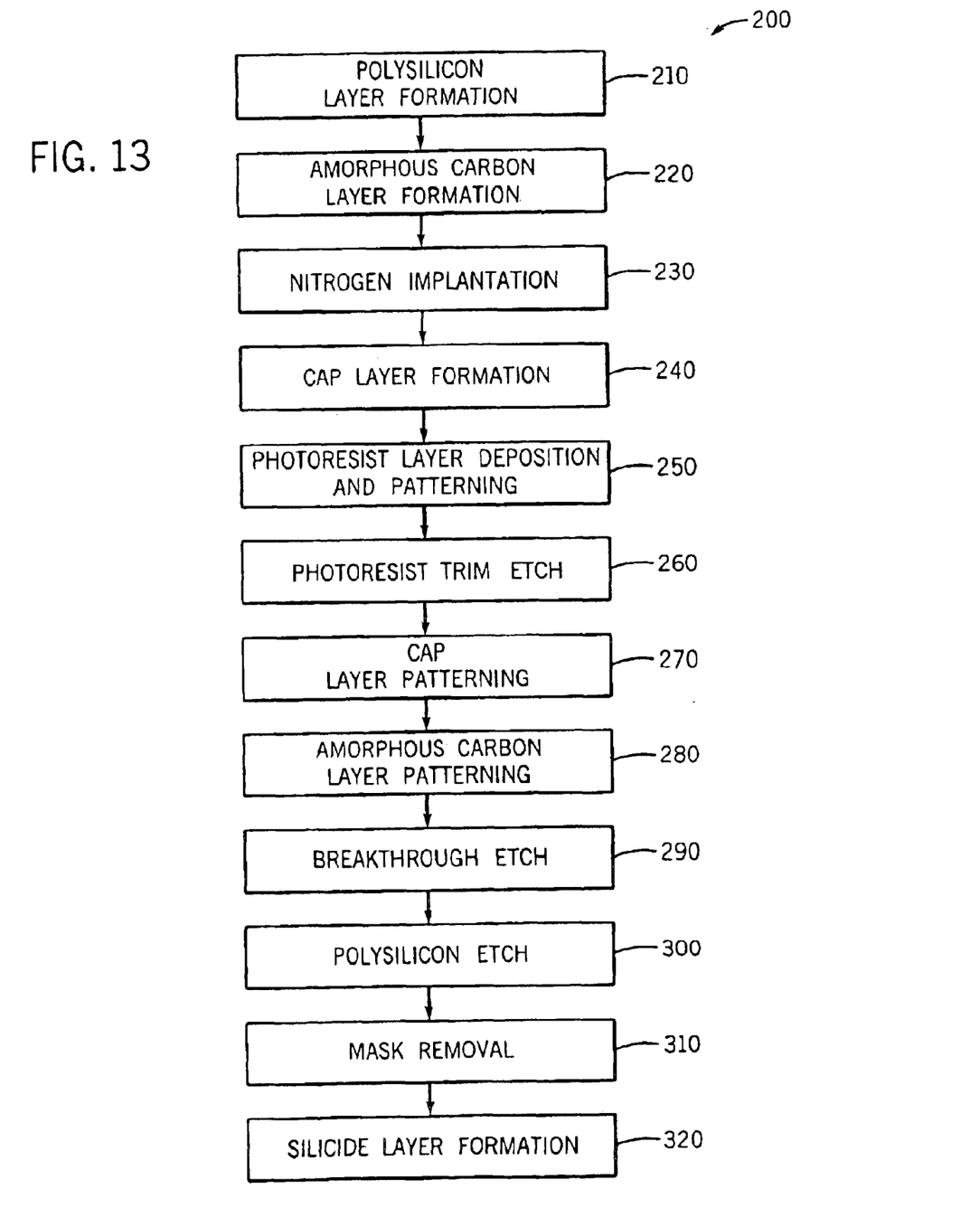
FIG. 13 is a flow diagram illustrating the process of forming a fuse in an integrated circuit.

In a step 310 shown in FIG. 12, amorphous carbon mask 62 is removed after polysilicon layer 40 is patterned. The amorphous carbon may be removed using an oxygen-containing plasma at a temperature of between approximately 180° and 220° C.

In a step 320, a silicide layer 50 is disposed above conductive material portion 15. Preferably, silicide layer 50 is a nickel silicide. Alternatively, layer 50 can be any type of refractory metal and silicon combination, such as, a cobalt silicide, tungsten silicide, titanium silicide, or any other silicide material. Silicide layer 50 may be formed using conventional processing techniques. For example, layer 50 can be formed in a low temperature process in which a silicide metal (e.g., nickel) is deposited on conductive material portion 15 and is heated to form layer 50. Preferably, layer 50 has a thickness of between approximately 10 and 20 nanometers. Metal contacts 20 can also be coupled to layer 50 at this point using conventional methods.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. The invention is not limited to a particular embodiment, but extends to various modifications, combinations, and permutations that nevertheless fall within the spirit and scope of the appended claims.

What is claimed is:

1. A method of forming a fuse for use in an integrated circuit, the method comprising:
   providing a mask material layer over a conductive layer, the mask material layer comprising amorphous carbon;
   doping the mask material layer with nitrogen;
   forming an anti-reflective coating (ARC) feature over the mask material layer;
   removing a portion of the mask material layer according to the ARC feature to form a mask;
   removing the ARC feature to form a warped mask;
   patterning the conductive layer according to the warped mask to form a patterned conductive layer;
   removing the warped mask; and
   providing a silicide layer over the patterned conductive layer.

2. The method of claim 1, wherein the step of forming an ARC feature comprises providing a layer or ARC material including at least one of silicon nitride, silicon oxynitride, silicon-rich oxide, and silicon-rich nitride over the mask material layer and etching the layer of ARC material to form the ARC feature.

3. The method of claim 1, wherein the step of doping the mask material layer comprises forming a layer comprising nitrogen above the mask material layer and diffusing the nitrogen into the mask layer.

4. The method of claim 1, wherein the step of doping the mask material layer comprises implanting nitrogen to form a mask material layer comprising between approximately 6 and 12 atomic percent nitrogen.

5. The method of claim 1, wherein the steps of removing a portion of the mask material layer and removing the warped mask comprise using an oxygen-based plasma.

6. The method of claim 1, wherein the patterned conductive layer and the silicide layer fuse have a generally non-linear shape.

7. The method of claim 1, wherein the mask has a width of less than approximately 50 nanometers.

8. The method of claim 1, wherein the silicide layer comprises at least one of nickel silicide, cobalt silicide, titanium silicide, and tungsten silicide.

9. A method of forming a fuse in an integrated circuit comprising:
   depositing a layer comprising amorphous carbon above a layer of polysilicon;
   introducing nitrogen into the layer comprising amorphous carbon;
   forming an anti-reflective coating (ARC) mask over above the layer comprising amorphous carbon;
   patterning the layer comprising amorphous carbon according to the ARC mask to form a mask feature having a shape;
   altering the shape of the mask feature by removing the ARC mask to form a mask feature having a non-linear shape;
   removing a portion of the layer of polysilicon according to the mask feature to form a non-linear polysilicon feature; and
   providing a layer comprising a metal silicide above the non-linear polysilicon feature.

10. The method of claim 9, further comprising removing the mask feature using an oxygen-based plasma before the step of providing a layer comprising metal silicide.

11. The method of claim 9, wherein the step of introducing nitrogen comprises one of implanting nitrogen and diffusing nitrogen into the layer comprising amorphous carbon.

12. The method of claim 9, wherein the anti-reflective coating layer comprises at least one of silicon nitride, silicon oxynitride, silicon-rich nitride, and silicon-rich oxide.

13. The method of claim 9, wherein the mask feature has a width of between approximately 30 and 60 nanometers and the ARC layer has a thickness of between approximately 200 and 400 angstroms.

14. The method of claim 9, wherein the step of removing a portion of the layer of polysilicon comprises forming a polysilicon feature having a plurality of transition regions that act as weak spots in the fuse.

15. The method of claim 9, wherein the layer comprising a metal silicide comprises at least one of nickel silicide, tungsten silicide, titanium silicide, and cobalt silicide.

16. A fuse for an integrated circuit produced by a method comprising the steps of:
   providing a mask material comprising amorphous carbon and nitrogen above a layer of polysilicon;
   providing a cap layer over the mask material, the cap layer comprising an anti-reflective coating (ARC) material;
   etching the cap layer to form a cap feature;

patterning the mask material according to the cap feature to form a mask;

removing the cap feature to warp the mask;

patterning the layer of polysilicon according to the mask after the cap feature is removed to form a polysilicon feature;

removing the mask; and forming a silicide layer above the polysilicon feature.

17. The fuse of claim 16, wherein the step of providing a mask material comprises depositing the mask material in a PECVD process with nitrogen incorporated therein.

18. The fuse of claim 16, wherein the step of providing a mask material comprises depositing pure amorphous carbon and doping the pure amorphous carbon with nitrogen.

19. The fuse of claim 16, wherein the mask material comprises between approximately 6 and 12 atomic percent nitrogen.

20. The fuse of claim 16, wherein the polysilicon feature and the silicide layer have a shape comprising a plurality of transition areas that act as areas of weakness in the fuse.

* * * * *